United States Patent [19]

Yukawa

[11] Patent Number: 4,661,802
[45] Date of Patent: Apr. 28, 1987

[54] DIGITAL-TO-ANALOG CONVERTER

[75] Inventor: Akira Yukawa, Tokyo, Japan

[73] Assignee: NEC Corporation, Tokyo, Japan

[21] Appl. No.: 760,429

[22] Filed: Jul. 30, 1985

[30] Foreign Application Priority Data

Jul. 31, 1984 [JP] Japan .................. 49-160499

[51] Int. Cl.$^4$ .................................. H03K 13/02
[52] U.S. Cl. ................. 340/347 DA; 307/243
[58] Field of Search ............. 340/347 DA, 347 CC, 340/347 DA; 307/243

[56] References Cited

U.S. PATENT DOCUMENTS

| | | | |
|---|---|---|---|
| 3,582,939 | 6/1971 | Campbell | 340/347 DA |
| 3,744,050 | 7/1973 | Hedrick | 340/347 DA |
| 3,877,023 | 4/1975 | Spicer et al. | 340/347 DA |
| 4,198,622 | 4/1980 | Connolly, Jr. et al. | 340/347 DA |
| 4,398,179 | 8/1983 | Kaneko | 340/347 DA |
| 4,430,642 | 2/1984 | Weigand et al. | 340/347 DA |
| 4,494,107 | 1/1985 | Kearns et al. | 340/347 DA |
| 4,542,371 | 9/1985 | Uchikoshi | 340/347 DA |

FOREIGN PATENT DOCUMENTS 0137174 8/1979 Fed. Rep. of Germany .

Primary Examiner—William M. Shoop, Jr.
Assistant Examiner—Sharon D. Logan
Attorney, Agent, or Firm—Sughrue, Mion, Zinn, Macpeak & Seas

[57] ABSTRACT

A D/A converter comprising two capacitor arrays consisting of capacitors with weighted by a factor of two, and shift switches for coupling each of the capacitors selectively to one of two reference voltages, one of the capacitors of one array and one of the capacitors of the other array being paired to correspond to one data bit in each input binary code, a balanced operational amplifier having two complementary inputs and two complementary outputs respectively associated with the inputs, a feedback capacitor connected between each of the inputs and each of the outputs of the operational amplifier, polarity switches having a state providing connection from one array to the one input and from the other array to the other input of the operational amplifier and a state providing connection from the one array to the other input and from the other capacitor array to the one input of the operational amplifier, and a control circuit to detect the polarity of the voltage into which each input binary code is to be converted. The control circuit is operative to control the shift switches to shift each of the capacitors between the two reference voltages depending on the status of the data bit corresponding to the paired capacitors and to shift the polarity switches between the two states thereof depending on the detected polarity.

8 Claims, 3 Drawing Figures

DIGITAL-TO-ANALOG CONVERTER

FIELD OF THE INVENTION

The present invention relates to digital-to-analog converters and, more particularly, to a digital-to-analog converter of the weighted-capacitance, voltage-output type. As will be understood as the description proceeds, a digital-to-analog converter according to the present invention is particularly adapted for use on an LSI or VLSI system.

SUMMARY OF THE INVENTION

A D/A converter circuit according to the present invention is characterized, inter alia, in that digital-to-analog converted output signals are produced as balanced output voltages from a balanced operational amplifier to eliminate the noises originating in the power supplied to the operational amplifier and the noises resulting from the parasitic capacitances of the capacitor array used in the converter circuit. This is achieved by producing two complementary output voltages and then a differential voltage therebetween so that the noise components in the two output voltages are cancelled by each other in the resultant differential voltage. The differential voltage, produced as a final output signal from the D/A converter circuit, has an amplitude which may be twice as large as the amplitude of the output voltage from a conventional D/A converter circuit of the described type even when the amplitude which could be used in the converter circuit according to the present invention is reduced to one half thereof. A D/A converter circuit according to the present invention is further characterized in that only one reference voltage is used in addition to the ground voltage. This is realized by varying the direction in which the voltage of the pulses to be applied from the capacitor array to the operational amplifier and by changing the polarity in which the capacitor array is to be connected to the operational amplifier depending upon the polarity of the voltage into which a binary code is to be converted. Thus, a D/A converter circuit herein proposed is capable of producing an increased maximum analog voltage with use of a relatively low reference voltage.

In accordance with the present invention, there is provided a digital-to-analog converter for converting binary codes into analog voltages, each of the binary codes including a predetermined number of data bits comprising (1) first and second capacitor arrays each comprising a predetermined number of capacitors having respective capacitances weighted to progressively vary by a factor of a predetermined number from one to another, and selective coupling means for coupling each of the capacitors selectively to a source of a single predetermined reference voltage and a source of a ground reference voltage, one of the capacitors of the first capacitor array and one of the capacitors of the second capacitor array being paired to correspond to one of the data bits in each of the binary codes, (2) a balanced operational amplifier having complementary first and second input terminals and complementary first and second output terminals, (3) a parallel combination of a first feedback capacitor and a first reset switch connected between the first input and output terminals of the operational amplifier, (4) a parallel combination of a second feedback capacitor and a second reset switch connected between the second input and output terminals of the operational amplifier each of the first and second feedback capacitors having a capacitance larger by a factor of two than the largest one of the capacitances of the capacitors in each of the first and second capacitor arrays, (5) polarity switch means having a first state providing connection from the first capacitor array to the first input terminal and from the second capacitor array to the second input terminal of the operational amplifier and a second state providing connection from the first capacitor array to the second input terminal and from the second capacitor array to the first input terminal of the operational amplifier, and (6) control means responsive to the binary codes and operative to detect the polarity of the voltage into which each of the binary codes is to be converted, the control means being coupled to the selective coupling means and the polarity switch means and being further operative to control the coupling means to shift each of the capacitors selectively between the a single predetermined reference voltage and the ground voltage depending upon the status of the data bit which corresponds to the paired capacitors and to shift the polarity switch means between the first and second states thereof depending upon the detected polarity of the voltage into which each of the binary codes is to be converted. In a converter circuit thus constructed and arranged, the selective coupling means of each of the capacitor arrays comprises shift switches corresponding in number and provided respectively in series with the capacitors, each of the shift switches being connected to the single predetermined source of the reference voltage and the source of the ground voltage, one of the shift switches of the first capacitor array and one of the shift switches of the second capacitor array being paired to correspond to one of the data bits in each of the binary codes, the control means being associated with the selective coupling means and being operative to shift each of the shift switches selectively between the single predetermined reference voltage and the ground voltage depending upon the status of the data bit which corresponds to the paired capacitors.

BRIEF DESCRIPTION OF THE DRAWINGS

The drawbacks of a prior-art D/A converter circuit and the features and advantages of a D/A converter circuit according to the present invention will be more clearly understood from the following description taken in conjunction with the accompanying drawings, in which.

DESCRIPTION OF THE PRIOR ART

Figure 1:
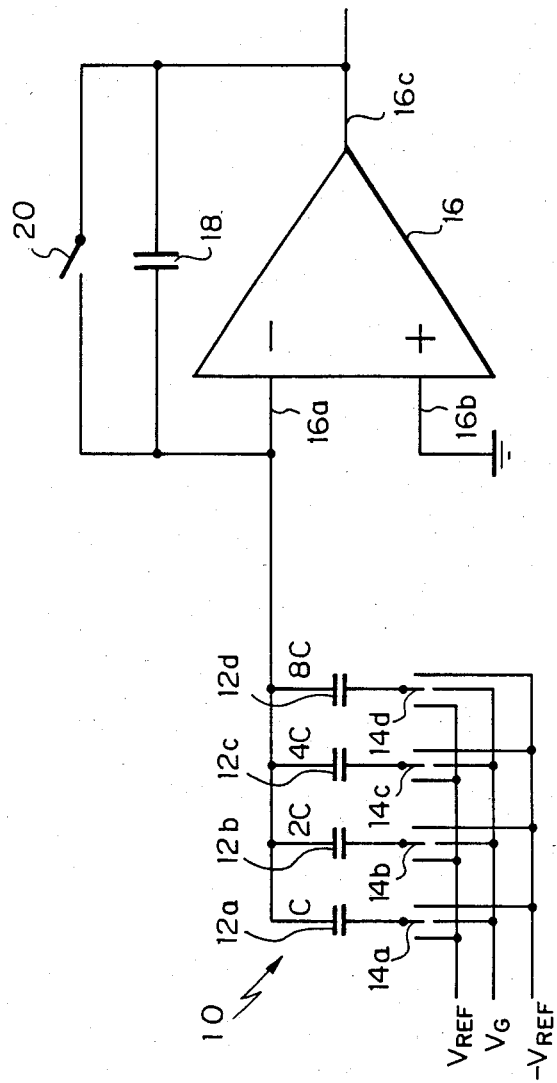
FIG. 1 is a diagram showing the circuit arrangement of a typical example of a known D/A converter circuit of the weighted-capacitance, voltage-output type.

In FIG. 1 is shown the general circuit arrangement of a typical example of a known four-bit plus-sign digital-to-analog converter of the weighted-capacitance, voltage-output type. The D/A converter circuit includes a weighted capacitor array 10 responsive to the four data bits in each of supplied binary codes. The capacitor array 10 consists of a parallel combination of four, first to fourth, capacitors 12a to 12d and four three-position shift switches 14a to 14d which are provided in series with the capacitors 12a to 12d, respectively. Each of the shift switches 14a to 14d is selectively connected to any one of positive and negative reference voltages $V_{REF}$ and $-V_{REF}$ and a ground voltage $V_G$ and produces either a logic "1" state or a logic "0" state when connected to any of the reference voltages $V_{REF}$ and $-V_{REF}$ and the ground voltage $V_G$. The capacitors 12a to 12d are connected in parallel to the inverting input terminal 16a of an operational amplifier 16, the non-inverting input terminal 16b of which is grounded. The inverting input terminal 16a and the output terminal 16c of the operational amplifier 16 are shunted by a parallel combination of a feedback capacitor 18 and a reset switch 20.

To produce the desired binary contributions to the output voltage of the D/A converter circuit, the successive capacitors 12a, 12b, 12c and 12d of the capacitor array 10 are weighted to have capacitances which progressively increment by a factor of two and which thus account for $1/16 (=C)$, $\frac{1}{8} (=2C)$, $\frac{1}{4} (=4C)$ and $\frac{1}{2} (=8C)$, respectively, of a predetermined full-scale capacitance 16C. The feedback capacitor 18 has a capacitance equal to this full-scale capacitance 16C. Though not shown in FIG. 1, the individual shift switches 14a to 14d are connected to suitable control means which receives the binary codes to be converted into analog signals and which is operative to detect from the supplied binary codes the polarities of the voltages into which the supplied binary codes are to be converted. The control means are further operative to shift any one or ones of the switches 14a to 14d between the two reference voltages $V_{REF}$ and $-V_{REF}$ depending upon the detected polarity indicated by each of the supplied binary codes when the switch or each of the switches corresponds to bit "1" in the supplied binary code.

During reset mode of operation, the reset switch 20 is closed and all the shift switches 14a to 14d of the weighted capacitor array 10 are connected to the ground voltage $V_G$ by the control signals from the above mentioned control means. The operational amplifier 16 being short circuited with the reset switch 20 closed, the capacitors 12a to 12d are charged to their respective weighted capacitances with the offset voltage of the operational amplifier 16 as appearing at the summing junction between the capacitor array 10 and the operational amplifier 16.

For conversion of the supplied binary codes into correspoding analog voltages during the subsequent conversion mode of operation, the reset switch 20 is made open and those of the shift switches 14a to 14d which correspond to the bits "0" in each of the supplied binary codes remain in situ and are thus connected to the ground voltage $V_G$. On the other hand, those of the shift switches 14a to 14d which correspond to the bits "1" in the supplied binary code are shifted either to the positive reference voltage $V_{REF}$ or to the negative reference voltage $-V_{REF}$ depending upon the polaritity of the voltage into which the particular binary code is to be converted. If, for example, the data bits in the supplied binary code happens to be in the form of "1001", the second and third shift switches 14b and 14c remain connected to the ground voltage $V_G$ and the first and second shift switches 14a and 14d are shifted to the positive reference voltage $V_{REF}$ or the negative reference voltage $-V_{REF}$. If, in this instance, the supplied binary code is to be converted into a voltage of the positive polarity, each of the first and second shift switches 14a and 14d is connected to the negative reference voltage $-V_{REF}$ and, if the supplied binary code is to be converted into a negative voltage, each of the shift switches 14a and 14d is connected to the positive reference voltage $V_{REF}$. If the particular binary code "1001" being currently supplied is assumed to be converted into, for example, a voltage of the positive polarity, the first and fourth shift switches 14a and 14d are shifted to the negative reference voltage $-V_{REF}$. These selective switching motions of the shift switches 14a to 14d are performed under the control of a signal from the control means associated with the shift switches. The first and fourth capacitors 12a and 12d respectively corresponding to the most and least significant bits (MSB and LSB) of the supplied binary code are thus connected to the negative reference voltage $-V_{REF}$ with the remaining capacitors 12b and 12c connected to the ground voltage $V_G$. Under these conditions, a voltage of $V_{REF} \times (C+8C)/16C = 9/16 \times V_{REF}$ appears at the output terminal 16c of the operational amplifier 16.

The conventional D/A converter circuit constructed and operative as hereinbefore described is advantageous for its excellent performance accuracy and in that it can be readily implemented on a semiconductor integrated circuit chip. Such a D/A converter circuit however has a problem in that the output voltages from the operational amplifier 16 could not be free from the noises originating in the power supply for the operational amplifier 16. Another problem of the D/A converter circuit of the described type is that the output voltages of the converter circuit further contain noises resulting from the parasitic capacitances of the capacitor array 10, which are caused by the wiring of the capacitor array and the reset switch.

These problems could be solved or alleviated to a considerable extent if the D/A converter circuit alone forms a single semiconductor integrated circuit per se. Where, however, a semiconductor integrated circuit be configured to include not only a D/A converter circuit but also various other functional units and elements as is frequently the case with recent integrated circuit chips, restrictions are imposed on the solution of the problems encountered. Difficulties are thus experienced in reducing the noises contained in the output voltages and accordingly in achieving satisfactory signal-to-noise ratios in D/A converter circuits of the described type, especially where the converter circuits are only part of integrated circuit chips.

Consonantly, furthermore, with the scaling up of semiconductor integrated circuits in general, it is required that the source voltages to be used be reduced to the lowest possible levels. This places limits to the ranges of the voltages operable for the D/A converter circuits implemented on semiconductor integrated circuit chips.

Another problem of the prior-art D/A converter circuit of the described type results from the fact that the range operable of the output voltages of the D/A converter circuit falls within the operable voltage range of the operational amplifier used in the converter circuit as previously noted. Specifically, the maximum amplitude of the sinusoidal voltage which can be produced by the D/A converter circuit is equal to one half of the operable voltage range of the operational amplifier. Now that the plus and minus 5 volt source voltages which have thus far been frequently used for MOS integrated circuits are being supplanted by a single plus 5 volt source voltage, this means that the maximum voltage operable at the output terminal of the operational amplifier may be reduced as much. Such reduction in the maximum output voltage of the operational amplifier gives rise to an increase in the contribution of noises to the output voltages of the D/A converter circuit and accordingly to deterioration in the signal-to-noise ratio of the converter circuit. This tendency is pronounced as integrated circuits are scaled up.

In connection with the D/A converter circuit of the type described, it may be further pointed out that such a converter circuit requires the use of two positive and negative reference voltages which necessitate strict matching therebetween. Furthermore, the use of the operational amplifier of the non-balanced type is disadvantageous from the view point of providing compatibility between the D/A converter circuit and any of the existing communication systems such as the telephone communication system using complementary signals.

It is, accordingly, an important object of the present invention to provide an improved D/A converter circuit in which the contribution of the noises originating in the supplied power to the output voltages from the converter circuit is reduced significantly.

It is another important object of the present invention to provide an improved D/A converter circuit in which the output voltages of the converter circuit are free from the influence of the noises resulting from the parasitic capacitances of the capacitor array used in the converter circuit.

It is still another important object of the present invention to provide an improved in which only one positive or negative reference voltage is used in addition to the ground voltage to eliminate the need for strict matching as has been required between the two positive and negative reference voltages used in addition to the ground voltage in a prior-art of the described type.

It is, yet, still another important object of the present invention to provide an improved D/A converter circuit which uses an operational amplifier of the balanced type for providing compatibility between the converter circuit and any of the existing communications systems using balanced output signals.

DESCRIPTION OF THE PREFERRED EMBODIMENT

Figure 2:
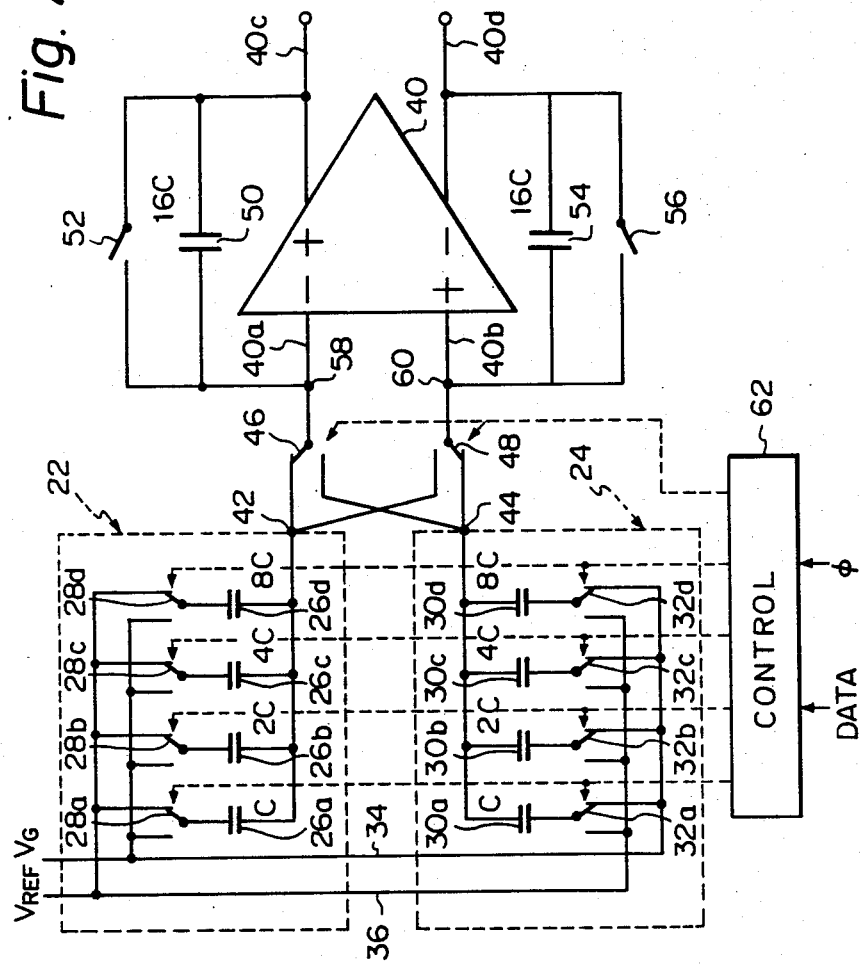
FIG. 2 is a diagram showing the general circuit arrangement of a preferred embodiment of a D/A converter circuit according to the present invention.

Referring to FIG. 2, a weighted-capacitance, voltage-output D/A converter circuit embodying the present invention comprises two weighted capacitor arrays which are shown consisting of a first capacitor array 22 and a second capacitor array 24. The D/A converter circuit is assumed, by way of example, as being of the four-bit plus-sign resolution type and, as such, each of these first and second capacitor arrays 22 and 24 is responsive to four data bits forming or included in each of the binary codes supplied either in parallel or in series from a preceding digital circuit stage (not shown). The first capacitor array 22 consists of a parallel combination of four, first to fourth, capacitors 26a to 26d and four two-position shift switches 28a to 28d which are provided in series with the capacitors 26a to 26d, respectively. Likewise, the second capacitor array 24 consists of a parallel combination of four, first to fourth, capacitors 30a to 30d and four two-position shift switches 32a to 32d provided in series with the capacitors 26a to 26d, respectively. Each of the shift switches 28a to 28d and shift switches 32a to 32d is to be selectively connected through a line 34 to a ground voltage $V_G$ or through a line 36 to a reference voltage $V_{REF}$. Each of the switches 28a to 28d connects the associated capacitor to the ground voltage $V_G$ and to the reference voltage $V_{REF}$ in response to logic "1" and "0". Similarly, each of the switches 32a to 32d connects the associated capacitor to the ground voltage $V_G$ and to the reference voltage $V_{REF}$ in response to logic "0" and "1", respectively. The reference voltage $V_{REF}$ to appear on the line 36 is herein assumed to be positive in polarity by way of example. Where the reference voltage $V_{REF}$ is of a negative potential, the relationship among the switching actions and the logics as noted above is inversed.

The successive capacitors 26a–26d/30a–30d of each of the first and second capacitor arrays 20 and 22 are weighted to have capacitances which progressively increment by a factor of two as shown. One of the capacitors 26a to 26d of the first capacitor array 22 and one of the capacitors 30a to 30d of the second capacitor array 24 are paired to correspond to one of the data bits in each of the binary codes to be supplied. Thus, each of the paired first capacitors 26a and 30a of the arrays 22 and 24 has a capacitance accounting for 1/16 (=C) of a predetermined full-scale capacitance 16C. Each of the paired second capacitors 26b and 30b of the arrays 22 and 24 has a capacitance accounting for ⅛ (=2C) of the full-scale capacitance. Each of the paired third capacitors 26c and 30c of the arrays 22 and 24 has a capacitance accounting for ¼ (=4C) of the full-scale capacitance. Each of the paired fourth capacitors 26d and 30d of the arrays 22 and 24 has a capacitance accounting for ½ (=8C) of the full-scale capacitance.

The D/A converter circuit embodying the present invention further comprises an operational amplifier 40 having complementary, negative-to-positive and positive-to-negative inverting first and second input terminals 40a and 40b and complementary first and second output terminals 40c and 40d which are respectively associated with the first and second input terminals 40a and 40b. The operational amplifier 40 provided in the D/A converter circuit embodying the present invention is, thus, of the balanced design. Examples of the operational amplifier of this nature are disclosed in "IEEE Journal of Solid-State Circuits", February 1983, page 58 and December 1983, page 661.

The capacitors 26a to 26d of the first capacitor array 22 are connected in parallel to a first switching junction 42 and, likewise, the capacitors 30a to 30d of the second capacitor array 24 are connected in parallel to a second switching junction 44. The first and second switching junctions 42 and 44 are provided in association with first and second polarity switches 46 and 48 respectively connected to the first and second input terminals 40a and 40b of the operational amplifier, each of the polarity switches 46 and 48 having two positions. The first polarity switch 46 has a first state connected to the first switching junction 42 and a second state connected to the second switching junction 44. On the other hand, the second polarity switch 48 has a first state connected to the second switching junction 44 and a second state connected to the first switching junction 42. The two polarity switches 46 and 48 are shifted to the respective first states as shown when the binary codes supplied are to be converted into voltages of the positive polarity and to the respective second states when the supplied binary codes are to be converted into voltages of the negative polarity.

The D/A converter circuit embodying the present invention further comprises a parallel combination of a first feedback capacitor 50 and a first reset switch 52 and a parallel combination of a second feedback capacitor 54 and a second reset switch 56. The parallel combination of the first feedback capacitor 50 and reset switch 52 is connected between the first input and output terminals 40a and 40c of the operational amplifier 40 and the parallel combination of the second feedback capacitor 54 and reset switch 56 is connected between the second input and output terminals 40b and 40d of the operational amplifier 40, as shown. Each of the first and second feedback capacitors 50 and 54 has a capacitance equal to the above mentioned full-scale capacitance 16C and each of the reset switches 52 and 54 is implemented by an MOS transistor in an N- or P-channel MOS IC, or by a pair of N-MOS and P-MOS transistors connected in parallel when implemented in CMOS IC configuration.

The shift switches 28a to 28d and shift switches 32a to 32d and the polarity switches 46 and 48 are operatively connected to a suitable control circuit 62. This control circuit 62, which also forms part of the D/A converter circuit embodying the present invention, is operative to detect the polarities of the voltages into which the supplied binary codes are to be converted. The polarity of the output voltage to result from each of the supplied binary codes is herein assumed to be expressed in the form of a sign bit or bits provided in addition to the four data bits in each of the supplied binary codes but, if desired, may be expressed in the form of four true data bits for positive polarity and four complementary data bits for negative polarity. The control circuit 62 is further operative to shift any one or ones of the switches 26a to 26d and switches 32a to 32d between the lines 34 and 36, viz., the ground voltage $V_G$ and the reference voltage $V_{REF}$ depending upon the detected polarity indicated by each of the supplied binary codes when the shift switch or each of the shift switches corresponds to a bit "1" in a supplied binary code. The switching actions of the first and second polarity switches 42 and 44 and those of the first and second reset switches 52 and 56 are also initiated under the control of signals from the control circuit 62.

Operation, in reset and conversion modes, of the D/A converter circuit thus constructed and arranged will now be described.

During reset mode of operation, the first and second reset switches 52 and 56 are kept closed so that the operational amplifier 40 is short circuited through these switches 52 and 56. The capacitors 26a to 26d of the first capacitor array 22 are charged to the respective weighted capacitances thereof with the offset voltage of the operational amplifier 40 as appearing at the first or second summing junction 58 or 60 depending upon the states of the first and second polarity switches 46 and 48. Similarly, the capacitors 32a to 32d of the second capacitor array 24 are charged to their respective weighted capacitances with the offset voltage of the operational amplifier 40 as appearing at the second or first summing junction 60 or 58. Furthermore, all the shift switches 28a to 28d of the first capacitor array 22 are connected through the line 36 to the positive reference voltage $V_{REF}$ while all the shift switches 32a to 32d of the second capacitor array 24 are connected through the line 34 to the ground voltage $V_G$, under the control of the signals from the control circuit 62. It may be herein noted that, if the reference voltage $V_{REF}$ is selected to be negative in polarity, then the shift switches 28a to 28d of the first capacitor array 22 are connected to the ground voltage $V_G$ and the shift switches 32a to 32d of the second capacitor array 24 are connected to the reference voltage $V_{REF}$ of the negative polarity.

During the conversion mode of operation subsequent to the reset mode, the reset switches 52 and 56 are made open and binary codes are supplied in cycles dictated by clock pulses $\phi$ to the control circuit 60. The control circuit 60 is thus enabled to produce control signals so that those of the shift switches 28a to 28d of the first capacitor array 22 which correspond to the bits "0" in each of the supplied binary codes remain connected to the reference voltage $V_{REF}$ and those of the shift switches 28a to 28d which correspond to the bits "1" in the supplied binary code are shifted to the ground voltage $V_G$ through the line 34. On the other hand, those of the shift switches 32a to 32d of the second capacitor array 24 which correspond to the bits "0" in each of the supplied binary codes remain connected to the ground voltage $V_G$ and those of the shift switches 32a to 32d which correspond to the bits "1" in the supplied binary code are shifted to the reference voltage $V_{REF}$ through the line 36. If, for example, the data bits in the supplied binary code happens to be in the form of "1010", the first and third shift switches 28a and 28c remain connected to the reference volta $V_{REF}$ and the second and fourth shift switches 28c and 28d are shifted to the ground voltage $V_G$ in the first capacitor array 22 and, in the second capacitor array 24, the first and third shift switches 32a and 32c remain connected to the ground voltage $V_G$ and the second and fourth shift switches 32c and 32d are shifted to the reference voltage $V_{REF}$. The polarity indicated by the binary code currently supplied to the control circuit 60 is assumed to be positive so that each of the first and second polarity switches 42 and 44 is held in its first state as shown.

The rises and drops of voltage thus caused through the individual shift switches of the capacitor arrays 22 and 24 are transferred through the respectively associated capacitors and give rise to a decrease in the potential at the first switching junction 42 and an increase in the potential at the second switching junction 44. Each of the input terminals and each of the output terminals of the operational amplifier 40 being connected together across the capacitor 50/54 having the capacitance of 16C as previously noted, the input terminals 40a and 40b of the operational amplifier 40 are in imaginary short circuited states so that the potentials at the first and second output terminals 40c and 40d of the operational amplifier 40 are caused to vary by values that will cancel the changes in the voltages through the individual shift switches of the capacitor arrays 22 and 24. The potentials thus varied at the output terminals 40c and 40d of the operational amplifier 40 are delivered as balanced output voltages from the operational amplifier 40. When the data bits in the supplied binary code are in the form of "1010" as above discussed, there thus appear a voltage of $V_{REF} \times (2C+8C)/16C = V_{REF} \times \frac{5}{8}$ at the first output terminal 40c and a voltage of $-V_{REF} \times (2C+8C)/16C = -V_{REF} \times \frac{5}{8}$ at the second output terminal 40. It therefore follows in this instance that a differential voltage of $V_{REF} \times 10/8 = V_{REF} \times 5/4$ is finally produced between the first and second output terminals 40c and 40d of the operational amplifier 40.

When the polarity indicated by the binary code being currently supplied to the control circuit 60 is negative, there will appear a voltage of $-V_{REF} \times \frac{5}{8}$ at the first output terminal 40c and a voltage of $V_{REF} \times \frac{5}{8}$ at the second output terminal 40 in response to the data bits "1010" of the binary code.

Figure 3:
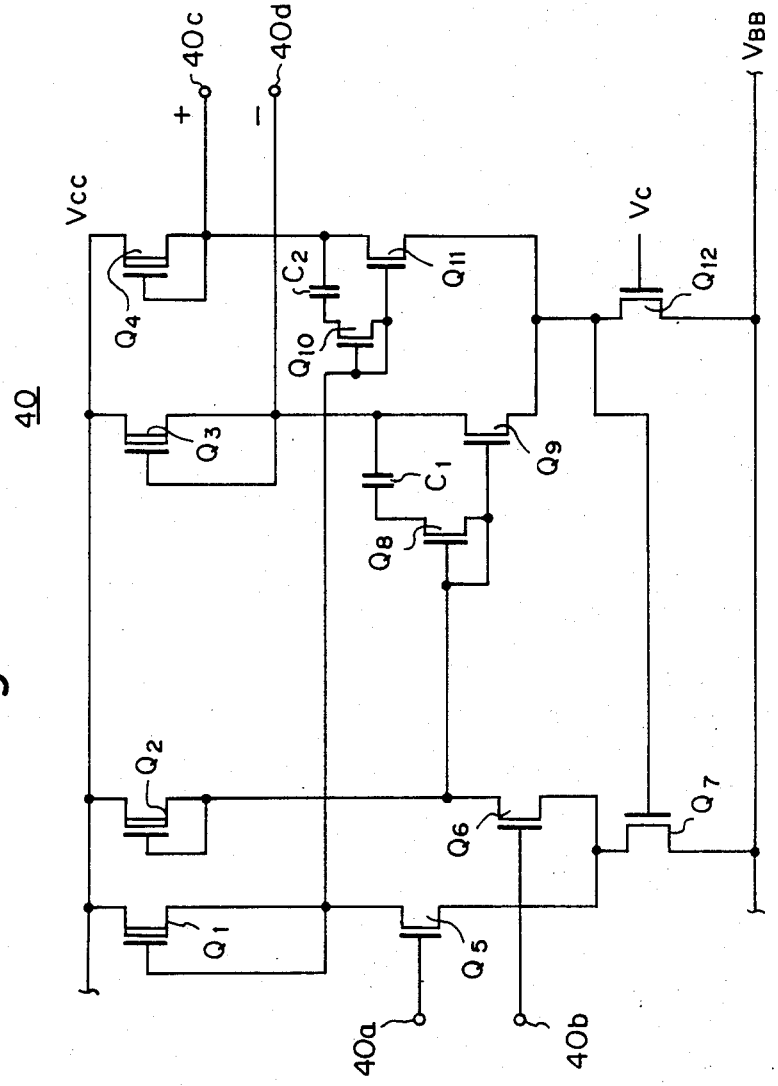
FIG. 3 is a schematic diagram showing an example of the balanced operational amplifier which forms part of a D/A converter circuit according to the present invention.

An example of the balanced operational amplifier 40 forming part of a D/A converter circuit according to the present invention is shown in FIG. 3. As shown, the balanced operational amplifier 40 comprises transiators $Q_1$ to $Q_{12}$ each consisting of a N-channel MOS FET. Of these transiators $Q_1$ to $Q_{12}$, each of the transiators $Q_1$ to $Q_4$ is of the depletion-type and each of the transiators $Q_5$ to $Q_{12}$ is of the enhancement-type. The MOS transistors $Q_1$, $Q_2$, $Q_5$, $Q_6$ and $Q_7$ constitute the differential input stage and the MOS transistors $Q_3$, $Q_4$, $Q_8$ to $Q_{12}$ constitute the subsequent differential stage. The gates of the MOS transistors $Q_5$ and $Q_6$ provide the previously mentioned input terminals 40a and 40b, respectively, of the operational amplifier 40. On the other hand, the gates of the MOS transistors $Q_3$ and $Q_4$ provide the output terminals 40c and 40d, respectively, of the amplifier 40. As the positive source voltage $V_{CC}$ is used $+5$ volts and as the negative source voltage $V_{BB}$ is used $-5$ volts. Indicated at $V_C$ is a bias voltage to enable the MOS transistor $Q_{12}$ to operate as a current source.

As will have been understood from the foregoing description, a D/A converter circuit according to the present invention has various advantages over prior-art D/A converters of particularly the type described with reference to FIG. 1. One of these advantages is that the contribution of the noises originating in the supplied power to the output voltages from the converter circuit is significantly reduced. The voltage range operable at each of the two output terminals of the operational amplifier 40 may be twice as high as the voltage range of the operational amplifier 40 per se and, for this reason, the signal-to-noise ratio of the D/A converter circuit can be doubled as compared to a prior-art D/A converter circuit of the described type provided the noise level is common to both of the converter circuits. Another advantage of a D/A converter circuit according to the present invention is that the output voltages of the converter circuit are free from the influence of the noises resulting from the parasitic capacitances of the capacitor arrays 22 and 24 used in the converter circuit. Such noise components are contained equally in both of the two analog output signals of the operational amplifier 40 and are thus completely cancelled by each other in the differential voltage to be produced as a final output of the converter circuit. Still another advantage of a D/A converter circuit according to the present invention is that only one reference voltage $V_{REF}$ suffices in addition to the ground voltage $V_G$ in producing at the two output terminals of the operational amplifier 40. This eliminates the need for strict matching between the two reference voltages $V_{REF}$ and $-V_{REF}$ used in addition to the ground voltage $V_G$ in a prior-art D/A converter circuit of the described type. Furthermore, the use of the operational amplifier 40 of the balanced type is advantageous for providing compatibility between the converter circuit and any of the existing communications systems using complementary output signals as in telephone communications systems.

While only one preferred embodiment of a D/A converter circuit according to the present invention has been hereinbefore described, such an embodiment is merely illustrative of the essential subject matter of the present invention and may therefore be modified and/or changed in numerous manners if and where desired. While, for example, the capacitor arrays 22 and 24 forming part of the D/A converter circuit embodying the present invention are of the four-bit configuration, the present invention may be embodied in a D/A converter circuit using capacitor arrays of the five-bit or six-bit configuration. Although, furthermore, the reference voltage $V_{REF}$ used in the D/A converter circuit embodying the present invention has been described as being positive in polarity, a reference voltage lower than the ground voltage may be used in lieu thereof. The capacitor arrays or even all the component units and elements of a capacitor array according to the present invention may be implemented on a single semiconductor chip in combination with various other functional units and elements also formed on the chip.

What is claimed is:

1. A digital-to-analog converter for converting binary codes into analog voltages, each of the binary codes including a predetermined number of data bits comprising
   (1) first and second capacitor arrays each comprising a predetermined number of capacitors having respective capacitances which are weighted to progressively vary by a factor of a predetermined number from one to another, and selective coupling means for coupling each of said capacitors selectively to a source of a single predetermined reference voltage and a source of a ground voltage, one of the capacitors of the first capacitor array and one of the capacitors of the second capacitor array being paired to correspond to one of the data bits in each of said binary codes,
   (2) a balanced operational amplifier having complementary first and second input terminals and complementary first and second output terminals,
   (3) a parallel combination of a first feedback capacitor and a first reset switch connected between the first input and output terminals of said operational amplifier;
   (4) a parallel combination of a second feedback capacitor and a second reset switch connected between the second input and output terminals of said operational amplifier, each of said first and second feedback capacitors having a capacitance larger by a factor of two than the largest one of the capacitances of the capacitors in each of said first and second capacitor arrays,
   (5) polarity switch means having a first state providing connection from said first capacitor array to the first input terminal and from said second capacitor array to the second input terminal of said operational amplifier and a second state providing connection from said first capacitor array to the second input terminal and from said second capacitor array to the first input terminal of said operational amplifier, and
   (6) control means responsive to said binary codes and operative to detect the polarity of the voltage into which each of the binary codes is to be converted, said control means being coupled to said selective coupling means and said polarity switch means and being further operative to control the coupling means to shift each of said capacitors selectively between said single predetermined reference voltage and said ground voltage depending upon the status of the data bit which corresponds to the paired capacitors and to shift said polarity switch means between said first and second states thereof depending upon the detected polarity of the voltage into which each of the binary codes is to be converted.

2. A digital-to-analog converter as set forth in claim 1, in which said selective coupling means of each of said capacitor arrays comprises shift switches corresponding in number and provided respectively in series with said capacitors, each of the shift switches being connected to the source of said single predetermined reference voltage and the source of said ground voltage, one of the shift switches of the first capacitor array and one of the shift switches of the second capacitor array being paired to correspond to one of the data bits in each of said binary codes, said control means being associated with said selective coupling means and being operative to shift each of said shift switches selectively between said single predetermined reference voltage and said ground voltage depending upon the status of the data bit which corresponds to the paired capacitors.

3. A digital-to-analog converter as set forth in claim 1 or 2, in which said factor is of the number two.

4. A digital-to-analog converter as set forth in claim 1 or 2, in which said single predetermined reference voltage has a ground potential.

5. A digital-to-analog converter as set forth in claim 3, in which said single predetermined reference voltage is higher than said ground voltage.

6. A digital-to-analog converter as set forth in claim 3, in which said ground voltage is higher than said single predetermined reference voltage.

7. A digital-to-analog converter as set forth in claim 1 or 2, in which each of said reset switches is implemented by an MOS transistor.

8. A digital-to-analog converter for converting binary codes into analog voltages, each of the binary codes including a predetermined number of data bits comprising (1) first and second capacitor arrays each comprising
  a predetermined number of capacitors having respective capacitances which are weighted to progressively vary by a factor of two from one to another, and
  shift switches corresponding in number and provided respectively in series with said capacitors in each of said capacitor arrays,
  each of the shift switches being having a state connected to a source of a predetermined reference voltage and a state connected to a source of a ground voltage for coupling the associated one of said capacitors selectively to the source of the predetermined reference voltage and the source of the ground voltage,
  one of the capacitors of the first capacitor array and one of the capacitors of the second capacitor array being paired to correspond to one of the data bits in each of said binary codes,
  one of the shift switches of the first capacitor array and one of the shift switches of the second capacitor array being paired to correspond to one of the data bits in each of said binary codes, (2) a balanced operational amplifier having complementary first and second input terminals and complementary first and second output terminals, (3) a parallel combination of a first feedback capacitor and a first reset switch connected between the first input terminal and the first output terminal of said operational amplifier, (4) a parallel combination of a second feedback capacitor and a second reset switch connected between the second input terminal and the second output terminal of said operational amplifier,
  each of said first and second feedback capacitors having a capacitance larger by a factor of two than the largest one of the capacitances of the capacitors in each of said first and second capacitor arrays, (5) a polarity switch network comprising
  a first switching junction connected to each of the capacitors of said first capacitor array,
  a second switching junction connected to each of the capacitors of said second capacitor array,
  first and second polarity switches which are respectively associated with the first and second switching junctions and which are respectively connected to the first and second input terminals of said operational amplifier,
  the first polarity switch having a first state providing connection from said first switching junction to the first input terminal of said operational amplifier and a second state providing connection from said second switching junction to the first input terminal of said operational amplifier and the second polarity switch having a first state providing connection from said second switching junction to the second input terminal of said operational amplifier and a second state providing connection from said first switching junction to the second input terminal of said operational amplifier,
  the first and second polarity switches being shifted to the respective first states thereof when the supplied binary codes are to be converted into voltages of one polarity and to the respective second states thereof when the supplied binary codes are to be converted into voltages of the opposite polarity, and (6) control means responsive to said binary codes and operative to detect the polarity of the voltage into which each of the binary codes is to be converted, said control means being operatively coupled to each of the shift switches of said first and second capacitor arrays and to each of said first and second polarity switches and being further operative to control each of the shift switches of each capacitor array to shift the associated capacitor selectively between the source of said predetermined reference voltage and the source of said ground voltage depending upon the status of the data bit which corresponds to the paired capacitors and to shift each of said polarity switches between said first and second states thereof depending upon the detected polarity of the voltage into which each of the binary codes is to be converted.

* * * * *